(12) United States Patent
Choi

(10) Patent No.: US 7,348,242 B2
(45) Date of Patent: Mar. 25, 2008

(54) NONVOLATILE MEMORY DEVICE AND METHODS OF FABRICATING THE SAME

(75) Inventor: Tae Ho Choi, Incheon-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 349 days.

(21) Appl. No.: 11/024,848

(22) Filed: Dec. 30, 2004

(65) Prior Publication Data
US 2005/0139894 A1 Jun. 30, 2005

(30) Foreign Application Priority Data
Dec. 31, 2003 (KR) ............. 10-2003-0101139

(51) Int. Cl.
*H01L 21/336* (2006.01)
(52) U.S. Cl. ............... 438/266; 257/E21.682
(58) Field of Classification Search ........ 438/266, 438/267, 304, 596; 257/E21.682
See application file for complete search history.

(56) References Cited

U.S. PATENT DOCUMENTS 5,936,883 A * 8/1999 Kurooka et al. ..... 257/E21.682
6,690,058 B2 2/2004 Wu
6,746,918 B2 6/2004 Wu
6,818,504 B2 11/2004 Rabkin et al.
6,818,512 B1 11/2004 Hsieh

* cited by examiner

*Primary Examiner*—Chandra Chaudhari
(74) *Attorney, Agent, or Firm*—Lowe Hauptman Ham & Berner LLP

(57) ABSTRACT

A method of fabricating a nonvolatile memory device including forming a plurality of device isolation layers in a semiconductor substrate to define a plurality of active regions, sequentially depositing an insulating layer and a first conductive layer on the semiconductor substrate, and forming a hard mask pattern on the first conductive layer. The method also includes forming a plurality of floating gates on the insulating layer by etching the first conductive layer using the hard mask pattern as a mask, forming a tunnel insulating layer on the semiconductor substrate including floating gates and the insulating layer, and depositing a second conductive layer on the tunnel insulating layer. The method further includes forming a plurality of control gate electrodes across the active regions by etching the second conductive layer, forming source and drain regions in the semiconductor substrate by performing an ion implantation, and forming contacts in the drain regions.

5 Claims, 4 Drawing Sheets

NONVOLATILE MEMORY DEVICE AND METHODS OF FABRICATING THE SAME

BACKGROUND OF THE INVENTION

1. Field of the Invention

The present disclosure relates to nonvolatile memory and, more particularly, to nonvolatile memory devices and methods of fabricating the same.

2. Description of the Related Art

Generally, semiconductor memory devices are divided into volatile memories and nonvolatile memories. The volatile memories, including chiefly random access memories (RAM) such as dynamic random access memories (DRAM) and static random access memories (SRAM), retain their memory data when the power is turned on, but lose the stored data when the power is turned off. In contrast, the nonvolatile memories, including chiefly read only memories (ROM), retain their memory data even after the power is turned off.

The nonvolatile memories may be subdivided into ROM, programmable ROM (PROM), erasable PROM (EPROM), and electrically erasable PROM (EEPROM).

From the view point of process technology, the nonvolatile memories may be divided into a floating gate family and a metal insulator semiconductor (MIS) family comprising a multi-layer of two or more dielectrics. The memory devices of the floating gate family use potential wells to achieve memory characteristics. For instance, EPROM tunnel oxide (ETOX) structures and split gate structures are widely applied to flash EEPROM. The split gate structure comprises two transistors in one cell. On the other hand, the memory devices of the MIS family perform memory functions by using traps positioned on a dielectric bulk, the interface between dielectrics, and the interface between the dielectric and the semiconductor. At present, the MONOS (metal oxide nitride oxide semiconductor)/SONON (semiconductor oxide nitride oxide semiconductor) structure is chiefly being employed for flash EEPROM.

FIG. 1 is a cross-sectional view of a flash memory cell structure formed by a related art technology. Referring to FIG. 1, a gate oxide layer 12 is deposited on a semiconductor substrate 10 having at least one device isolation layer 11. A first polysilicon layer 13 is deposited on the gate oxide layer 12. The first polysilicon layer 13 is used as a floating gate. A dielectric layer 15 and a second polysilicon layer 16 are sequentially deposited on the first polysilicon layer 13. The second polysilicon layer 16 is used as a control gate. A metal layer 17 and a nitride layer 18 are sequentially deposited on the second polysilicon layer 16. A cell structure is patterned to complete a flash memory cell by removing some portion of the gate oxide layer 12, the first polysilicon layer 13, the dielectric layer 15, the second polysilicon layer 16, the metal layer 17, and the nitride layer 18.

The above-mentioned flash memory cell has a flat-plate type floating gate and a control gate. Generally, in a flash memory, an electric potential of a control gate has to be thoroughly transferred to a floating gate to enhance the erase and program characteristics of a device. Specifically, when a flash memory performs a program function using hot carriers, the voltages of 0V, 5V, and 9V are applied to a source, a drain, and a control gate, respectively. If the voltage applied to the control gate is thoroughly transferred in a gate oxide via a floating gate and forms an electric field, hot electrons are more rapidly transferred into the floating gate. Contrarily, when the flash memory performs an erase function, the voltages of −7V and 5V are applied to the control gate and the source, respectively. In this case, electrons in the floating gate move toward the source by Fowler-Nordheim (F-N) tunneling. If the capacitance between the control gate and the floating gate is high and the capacitance between the floating gate and a substrate is low, the voltage of the floating gate is maintained at an even lower value. Therefore, more electrons move toward the source to increase the erase speed. In conclusion, in performing program or erase function, the smaller the voltage difference between a floating gate and a control gate becomes, the faster the operation speed of a flash memory becomes.

To improve program and erase characteristics of a semiconductor device, a method of using a material with high dielectric constant as a dielectric layer between a floating gate and a control gate has been suggested. However, the suggested method is being developed at present and requires more technical development.

A simple multi-layered ETOX cell structure is the simplest structure and can achieve a small cell in size. The ETOX cell structure, however, has a shortcoming that an effective cell size greatly increases because drain contacts have to be formed along a bit line. The simple multi-layered cell may have a very small size compared to other cell structures if those drain contacts are eliminated. On the other hand, from the viewpoint of device functionality, the cell malfunctions since an over erase must be controlled and the disturbance during program operation must be adjusted. In addition, because erase operation is performed through a silicon substrate, a source, or a drain, the reliability of a thin oxide layer must be ensured.

In a split gate structure cell, a select transistor without a floating gate and a storage transistor with a floating gate are serially connected. By having such an additional select transistor, the size of a unit cell becomes larger. Moreover, the cell size may considerably increase because a process margin is secured to self-align each gate and each channel of the select transistor and the storage transistor. However, from the viewpoint of device functionality, by using the additional select transistor, cell malfunctions due to an over erase can be prevented because the cell can be turned off by the select transistor, even if it is over erased. In addition, program disturbances can be prevented because a reverse program, in which a source region and a drain region are reversed due to asymmetric structure, is obviated.

However, in the split gate structure cell, junctions have to be preformed because a word line is formed in the same direction with that of active regions. In this case, a silicide process to reduce junction resistance cannot be performed because the junctions are formed by ion implantation and gates are then formed.

SUMMARY OF THE INVENTION

Accordingly, the present invention is directed to a nonvolatile memory device and methods of fabricating the same that substantially obviate one or more problems due to limitations and disadvantages of the related art.

The present invention advantageously provides a flash memory device with a small size, which obviates malfunctions due to an over erase and a reverse program. The present invention also provides methods of fabricating a flash memory device of split gate structure, which can perform a silicide process to reduce the resistance of cell junctions.

To achieve these objects and other advantages and in accordance with the purpose of the invention, as embodied and broadly described herein, the present invention provides a method of fabricating a nonvolatile memory device including forming a plurality of device isolation layers in a semiconductor substrate to define a plurality of active regions, sequentially depositing an insulating layer and a first conductive layer on the semiconductor substrate, forming a hard mask pattern on the first conductive layer, forming a plurality of floating gates on the insulating layer by etching the first conductive layer using the hard mask pattern as a mask, forming a tunnel insulating layer on the semiconductor substrate including floating gates and the insulating layer, depositing a second conductive layer on the tunnel insulating layer, forming a plurality of control gate electrodes across the active regions by etching the second conductive layer, forming source and drain regions in the semiconductor substrate by performing an ion implantation, and forming contacts in the drain regions.

It is to be understood that both the foregoing general description and the following detailed description of the present invention are exemplary, but are not restrictive of the invention.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to exemplary embodiments of the present invention which are illustrated in the accompanying drawings.

A split gate structure cell has buried junction structure in which junctions are preformed because a word line is formed in the same direction with that of active regions. In fabricating a split gate structure cell with the buried junction structure, a silicide process to reduce junction resistance is non-applicable because ion implantation is first performed and gates are then formed.

Figure 1:
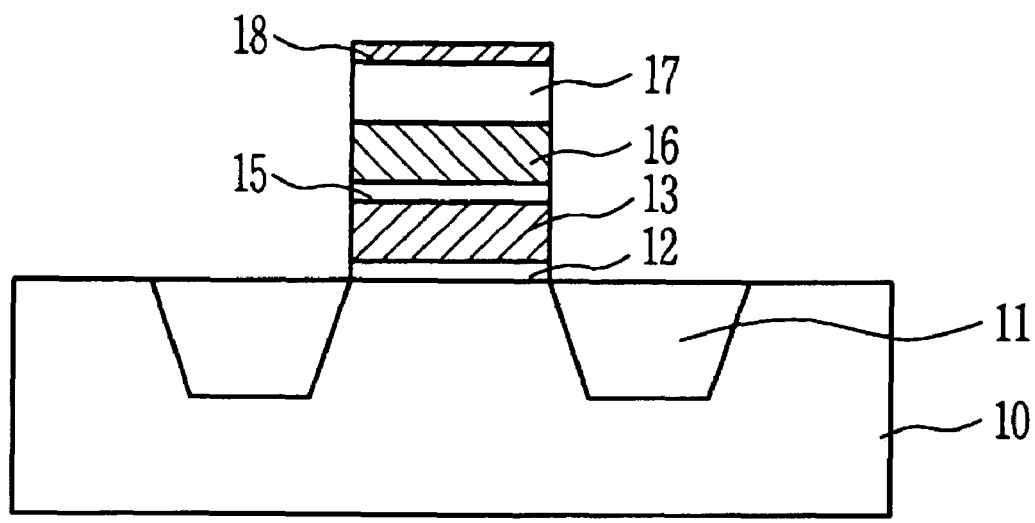
FIG. 1 is a cross-sectional view of a flash memory cell structure formed by a related art technology.
Figure 2:
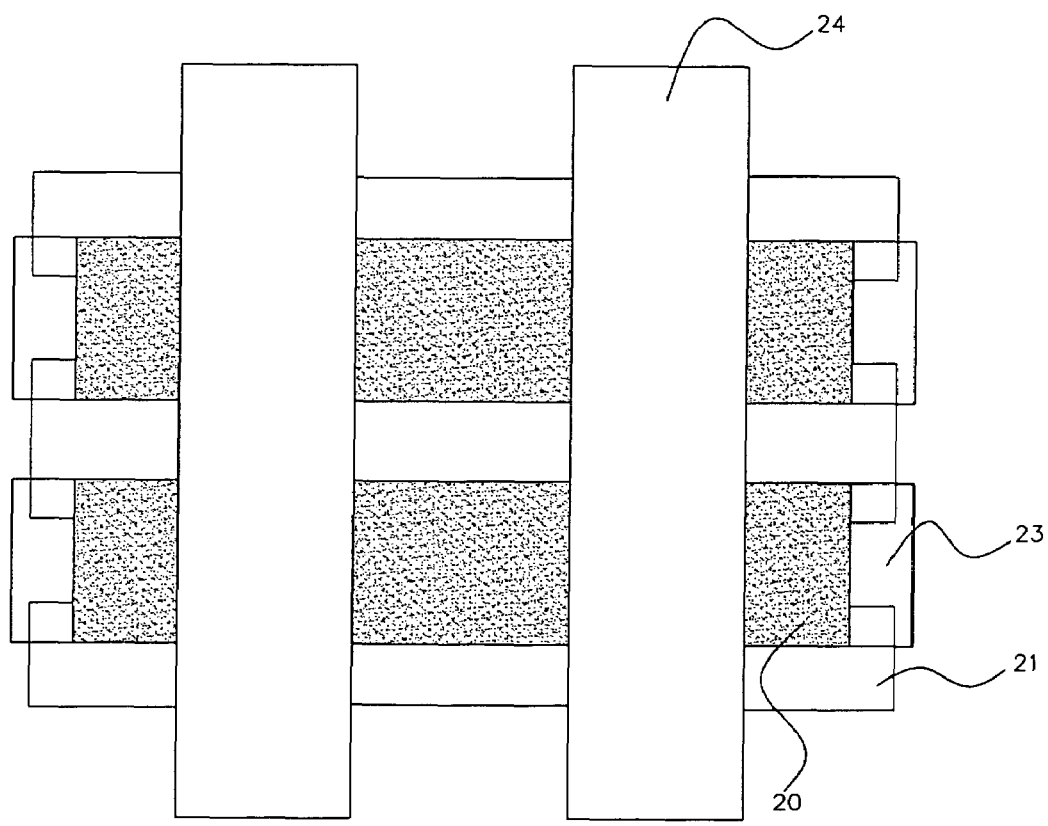
FIG. 2 is a plan view illustrating array structure of split gate structure cells fabricated by a related art technology.

FIG. 2 is a plan view illustrating an array structure of split gate structure cells fabricated by a related art technology. As shown in FIG. 2, a word line 23 is formed in an x-axis direction and a bit line 24 is positioned in a y-axis direction. Cell junctions (source, drain) are in the state of virtual ground and a silicide process cannot be performed.

Figure 3:
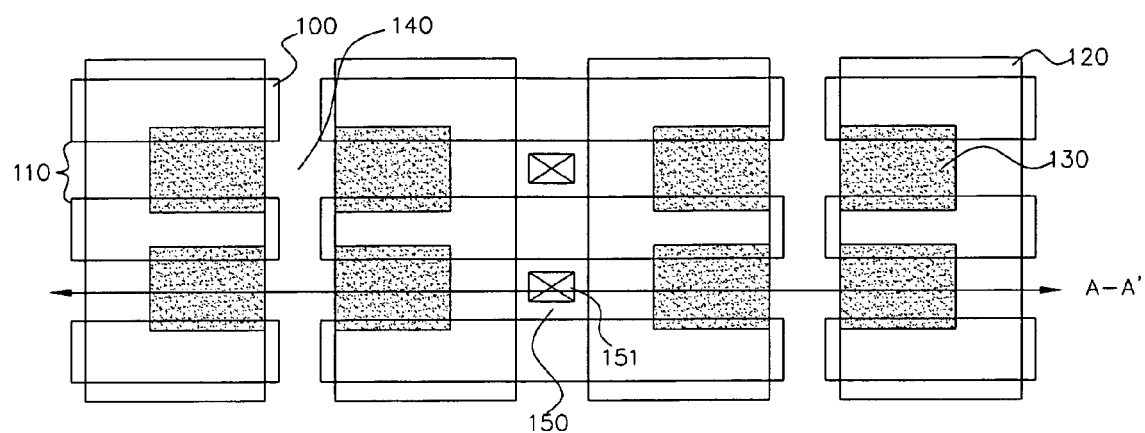
FIG. 3 is a plan view of an example array structure of split gate structure cells constructed in accordance with the present invention.

FIG. 3 is a plan view of an example array structure of split gate structure cells constructed in accordance with the present invention. A word line is positioned in a y-axis direction. A bit line connected to a drain contact is formed in an x-axis direction. In such an array structure, it is possible to perform a silicide process because an ion implantation for cell junctions is performed after final control gate formation is completed.

Referring to FIG. 3, a plurality of active regions 110 is defined by forming a plurality of device isolation layers 100 in a semiconductor substrate. A plurality of control gate electrodes 120 is formed across the stop regions of the active regions 110. Floating gates 130 are positioned between the control gate electrodes 120 and the active regions 110. The floating gates 130 are overlapped with the control gates 120. The control gate electrode 120 is extended from one sidewall of each floating gate 130 so that the control gate electrode 120 covers some portions of the active regions 110 adjacent the floating gates 130. Source regions 140 are formed in the active regions between adjacent floating gates. Drain regions 150 are formed in the active regions between portions of control gate electrodes 120 which are extended from one sidewall of each floating gate 130. A drain contact 151 as a bit line contact plug is positioned on each drain region 150. A tunnel oxide layer is deposited between the floating gates 130 and the control gates 120. A gate insulating layer is positioned between the floating gates 130 and the active regions. The gate insulating layer is extended so that it is positioned between the control gate electrodes and the active regions.

The tunnel oxide layer is extended from the sidewalls of the floating gates so that it is positioned between the control gate electrodes and the gate insulating layer. The above-mentioned split gate structure has bilateral symmetry.

FIGS. 4a through 4e are cross-sectional views of FIG. 3 taken along the line A-A', illustrating an example process of fabricating a nonvolatile memory device.

Figure 4A:
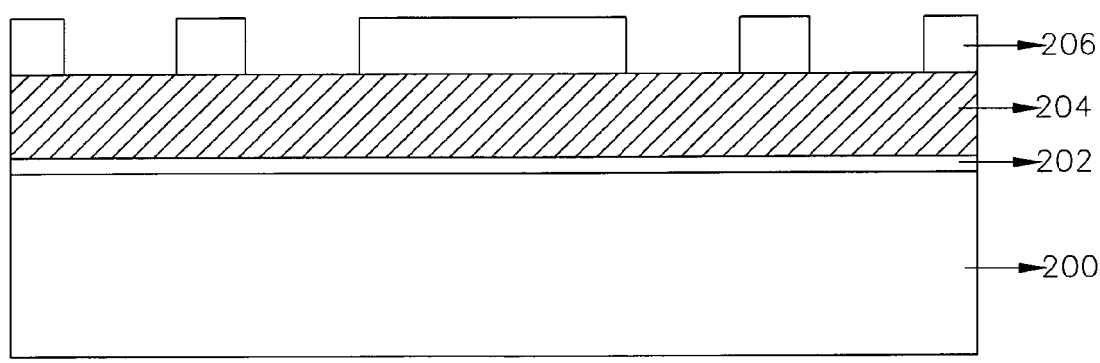
FIGS. 4a through 4e are cross-sectional views illustrating an example process of fabricating a nonvolatile memory device performed in accordance with the present invention.

Referring to FIG. 4a, a plurality of device isolation layers is formed in a semiconductor substrate 200 to define a plurality of active regions. Conductive wells are then formed in the semiconductor substrate 200. Then, an impurity implantation for threshold voltage adjustment may be performed. An insulating layer 202 and a first conductive layer 204 for floating gates are sequentially deposited on the semiconductor substrate 200. A hard mask layer is deposited on the first conductive layer 204. Some portion of the hard mask layer is removed to form a mesh-shaped hard mask pattern 206 on the first conductive layer 204. The first conductive layer 204 may be formed of a doped polysilicon layer. In another embodiment, the first conductive layer 204 may be formed of an undoped polysilicon layer and then doped with impurities by performing an ion implantation process using the hard mask pattern 206 as a mask. The hard mask layer may be made of an insulating material, for example, silicon nitride.

Figure 4B:
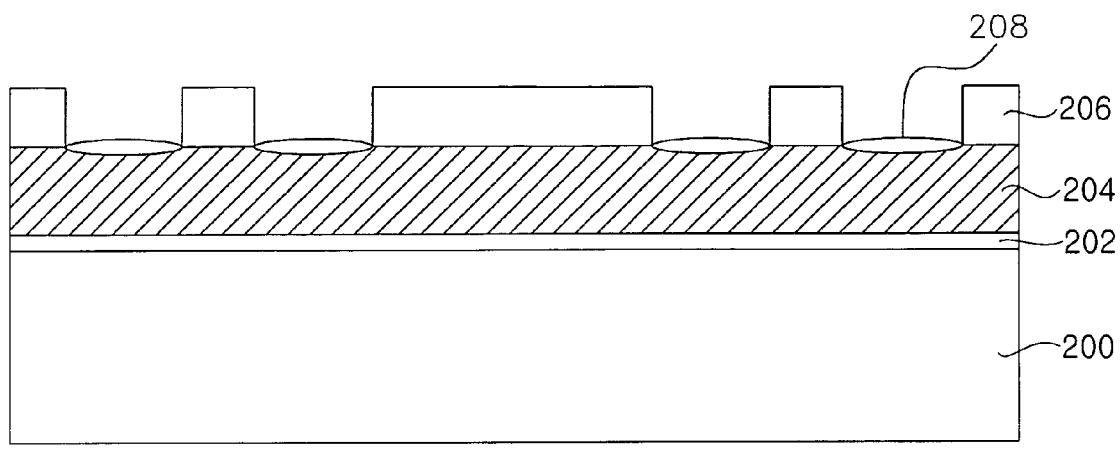

Referring to FIG. 4b, some portion of the first conducting layer 204 is oxidized to form an oxide pattern 208 on the first conductive layer 204. First conductive layer 204 is oxidized by performing a thermal oxidation process using the hard mask pattern 206 as an oxidation preventive mask. Then, the hard mask pattern 206 is removed.

Figure 4C:
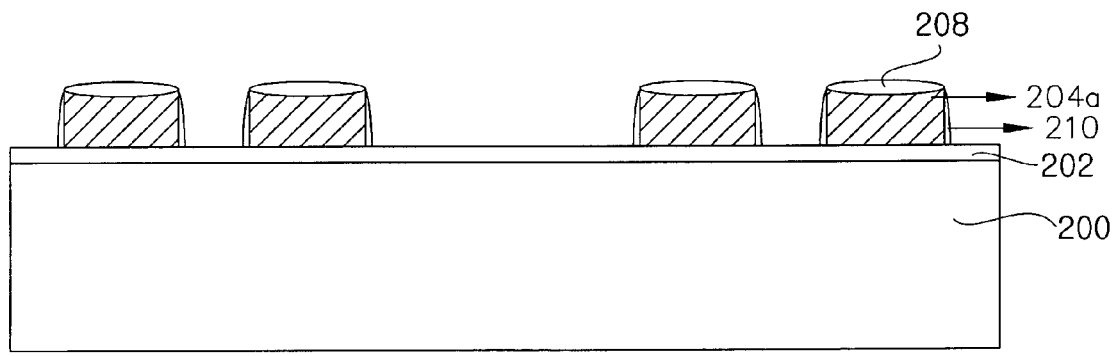
Figure 4D:
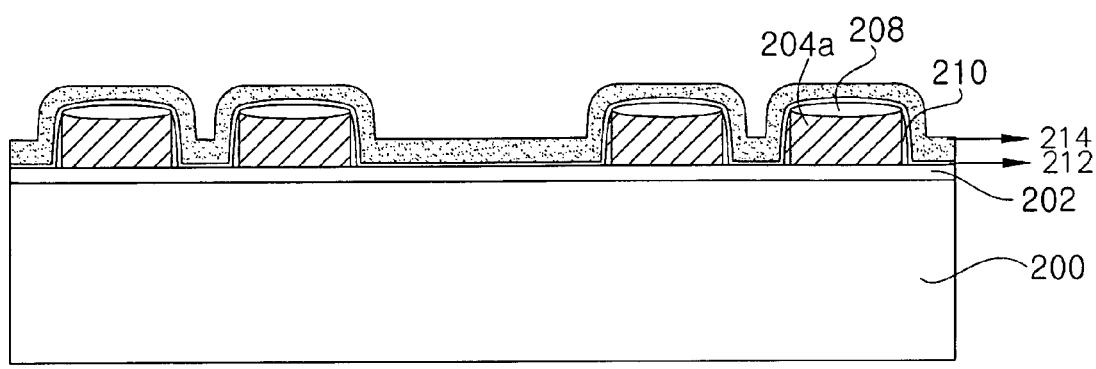

Referring to FIG. 4c, some portion of the first conductive layer 204 is removed by an etching process using the oxide pattern 208 as a mask. As a result, a plurality of floating gates 204a is formed over the semiconductor substrate 200. The floating gates 204a cover some portions of the active regions of the semiconductor substrate 200 and are arranged in the form of matrix. A thermal treatment process is performed on the semiconductor substrate including the floating gates 204a to form sidewall oxide layers 210 on the sidewalls of the floating gates 204a. In another embodiment, nitride spacers may additionally be formed on the sidewalls of the sidewall oxide layers 210. The nitride spacers may have a height less than that of the sidewall oxide layers 210. The nitride spacers are used to prevent reverse tunneling under the floating gates of a nonvolatile memory device. Referring to FIG. 4d, a tunnel insulating layer 212 is formed on the structure of FIG. 4c. A second conductive layer 214 for control gate electrodes is deposited on the tunnel insulating layer 212. The second conductive layer 214 may be made of polysilicon or metal polycide.

Figure 4E:
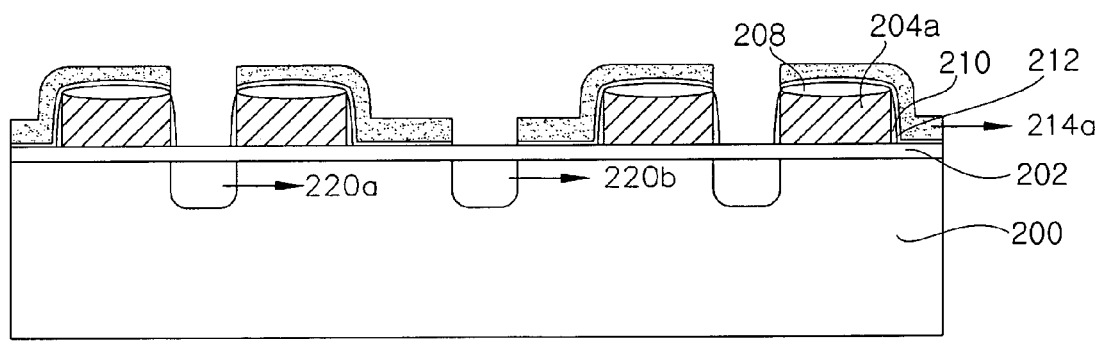

Referring to FIG. 4e, some portion of the second conductive layer 214 is removed to form a plurality of control gate electrodes 214a. The control gate electrodes 214a are laid across the active regions. The control gate electrodes 214a cover the top surface and one sidewall of each floating gate 204a. Each control gate electrode 214a is extended from one sidewall of each floating gate 204a so as to cover some portion of the active regions adjacent each floating gate 204a.

Impurities are implanted and diffused into the active regions of the semiconductor substrate 200. As a result, a source region 220a is formed in each active region between the adjacent floating gates 204a. Drain regions 220b are formed in each active region between the portions of control gate electrodes 214a which are extended from one sidewall of each floating gate 204a.

A metal layer is deposited on the structure of FIG. 4e and a silicide process is performed. An insulating layer is then deposited over the resulting structure. A bit line contact plug, which is connected with each drain region, is formed by forming a contact hole through the insulating layer on each drain region and filling the contact hole. A bit line parallel with the active regions, which is connected with each bit line contact plug, is formed over the semiconductor substrate.

Accordingly, by forming a word line across the active regions, the illustrated example process can expose some regions in which cell junctions are formed even after gates are formed. Therefore, the illustrated example process can form silicide layers to reduce the resistance of the junctions by performing junction ion implantation after the gates are formed and carrying out a silicide process. With the high-integration of semiconductor devices, the resistance of cell junctions increases, thereby deteriorating the uniformity of the cells in the cell array. Therefore, the described process of manufacturing a cell can be used to cope with problems due to the high-integration of semiconductor devices.

From the foregoing, persons of ordinary skill in the art will appreciate that the illustrated example process can reduce the size of a cell by constructing a NOR type array with mirror type symmetrical structure.

Korean Patent Application Number 10-2003-0101139, filed on Dec. 31, 2003, is hereby incorporated by reference in its entirety.

Although certain example methods, apparatus and articles of manufacture have been described herein, the scope of coverage of this patent is not limited thereto. On the contrary, this patent covers all methods, apparatus and articles of manufacturing fairly falling within the scope of the appended claims either literally or under the doctrine of equivalents.

What is claimed is:

1. A method of fabricating a nonvolatile memory device, said method comprising the steps of:
   forming a plurality of device isolation layers in a semiconductor substrate to define a plurality of active regions;
   sequentially depositing an insulating layer and a first conductive layer on the semiconductor substrate;
   forming a hard mask pattern on the first conductive layer;
   forming a plurality of floating gates on the insulating layer by etching the first conductive layer using the hard mask pattern as a mask;
   forming a tunnel insulating layer on the semiconductor substrate including the floating gates and the insulating layer;
   depositing a second conductive layer on the tunnel insulating layer;
   forming a plurality of control gate electrodes across the active regions by etching the second conductive layer; and
   forming source and drain regions in the semiconductor substrate by performing an ion implantation,
   wherein each of said control gate electrodes covers an entirety of a top surface and one side wall of the respective floating gate.

2. The method as defined by claim 1, wherein the step of forming source and drain regions includes forming source regions in the active regions between adjacent floating gates.

3. The method as defined by claim 1, wherein the step of forming source and drain regions includes forming drain regions in the active regions between portions of the control gate electrodes which are extended from one sidewall of each floating gate.

4. The method as claimed in claim 1, further comprising the step of forming contacts in the drain regions.

5. The method as claimed in claim 1, further comprising the step of forming sidewall oxide layers on sidewalls of the floating gates.

* * * * *